United States Patent
Chan et al.

(10) Patent No.: US 7,389,487 B1
(45) Date of Patent: Jun. 17, 2008

(54) DEDICATED INTERFACE ARCHITECTURE FOR A HYBRID INTEGRATED CIRCUIT

(75) Inventors: King W. Chan, Los Altos, CA (US);
William C. T. Shu, Palo Alto, CA (US);
Sinan Kaptanoglu, Belmont, CA (US);
Chi Fung Cheng, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 09/069,054

(22) Filed: Apr. 28, 1998
(Under 37 CFR 1.47)

(51) Int. Cl.
*G06F 17/50* (2006.01)

(52) U.S. Cl. .......................... 716/17; 716/16

(58) Field of Classification Search ............ 395/500.17; 716/16, 12; 326/39
See application file for complete search history.

(56) References Cited

U.S. PATENT DOCUMENTS

| | | | |
|---|---|---|---|
| 3,473,160 A | 10/1969 | Wahlstrom | |
| 4,433,331 A | 2/1984 | Kollaritsch | |
| 4,642,487 A | 2/1987 | Carter | |
| 4,700,088 A | 10/1987 | Tubbs | |
| 4,758,745 A * | 7/1988 | Elgamal et al. ............ | 307/465 |
| 4,870,302 A | 9/1989 | Freeman | |
| 4,873,459 A * | 10/1989 | El Gamal et al. ............ | 307/465 |
| 4,930,097 A | 5/1990 | Ledenbach et al. .......... | 364/716 |
| 4,969,121 A | 11/1990 | Chan et al. | |
| 4,999,698 A | 3/1991 | Okuno et al. | |
| 5,015,885 A | 5/1991 | El Gamal et al. | |
| 5,073,729 A | 12/1991 | Greene et al. | |
| 5,083,083 A | 1/1992 | El-Ayat et al. | |
| 5,107,146 A | 4/1992 | El-Ayat | |
| 5,137,393 A | 8/1992 | Fuhr et al. ................... | 307/465 |
| 5,172,014 A | 12/1992 | El Ayat et al. ............... | 307/465 |
| 5,187,392 A | 2/1993 | Allen .......................... | 307/465 |
| 5,187,393 A | 2/1993 | El Gamal et al. | |
| 5,191,241 A | 3/1993 | McCollum et al. | |
| 5,198,705 A | 3/1993 | Galbraith et al. ............ | 307/465 |
| 5,208,491 A | 5/1993 | Ebeling et al. ............... | 307/465 |
| 5,224,056 A * | 6/1993 | Chene et al. ................. | 364/490 |
| 5,304,860 A * | 4/1994 | Ashby et al. ............. | 307/296.3 |
| 5,313,119 A | 5/1994 | Cooke et al. | |
| 5,317,698 A | 5/1994 | Chan | |
| 5,323,069 A | 6/1994 | Smith, Jr. | |

(Continued)

FOREIGN PATENT DOCUMENTS

EP  0 415 542 A2  7/1990

(Continued)

OTHER PUBLICATIONS

M. Agarwala et al., An Architecture for a DSP Field-Programmable Gate Array, IEEE Transactions on VLSI Systems, pp. 136-141, Apr. 1995.*

(Continued)

*Primary Examiner*—Leigh Marie Garbowski
(74) *Attorney, Agent, or Firm*—Lewis and Roca, LLP

(57) ABSTRACT

An interface design for a hybrid IC that utilizes dedicated interface tracks to allow signals to interface distributively with the logic blocks of the FPGA portion providing for faster and more efficient communication between the FPGA and ASIC portions of the hybrid IC.

37 Claims, 14 Drawing Sheets

U.S. PATENT DOCUMENTS

| | | | | |
|---|---|---|---|---|
| 5,338,983 A * | 8/1994 | Agarwala | 307/465 |
| 5,347,181 A * | 9/1994 | Ashby et al. | 307/465 |
| 5,367,208 A | 11/1994 | El Gamal et al. | 326/44 |
| 5,400,262 A | 3/1995 | Mohsen | |
| 5,424,589 A | 6/1995 | Dobbelaere et al. | |
| 5,440,453 A | 8/1995 | Cooke et al. | 361/790 |
| 5,451,887 A | 9/1995 | El-Avat et al. | 326/39 |
| 5,452,231 A * | 9/1995 | Butts et al. | 364/489 |
| 5,457,410 A | 10/1995 | Ting | |
| 5,469,003 A * | 11/1995 | Kean | 326/39 |
| 5,504,354 A | 4/1996 | Mohsen | |
| 5,581,199 A | 12/1996 | Pierce et al. | |
| 5,594,367 A * | 1/1997 | Trimberger et al. | 326/41 |
| 5,600,265 A | 2/1997 | El Gamal et al. | 326/41 |
| 5,654,564 A | 8/1997 | Mohsen | |
| 5,671,432 A * | 9/1997 | Bertolet et al. | 395/800 |
| 5,682,107 A | 10/1997 | Tavana et al. | |
| 5,701,091 A | 12/1997 | Kean | |
| 5,742,181 A * | 4/1998 | Rush | 326/41 |
| 5,744,979 A | 4/1998 | Goetting | 326/39 |
| 5,744,980 A | 4/1998 | McGowan et al. | 326/40 |
| 5,760,604 A | 6/1998 | Pierce et al. | |
| 5,761,099 A | 6/1998 | Pedersen | |
| 5,801,546 A | 9/1998 | Pierce et al. | 326/39 |
| 5,808,351 A | 9/1998 | Nathan et al. | 257/528 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,835,751 A * | 11/1998 | Chen et al. | 395/500 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,859,542 A | 1/1999 | Pedersen | 326/39 |
| 5,859,543 A | 1/1999 | Kolze | 326/39 |
| 5,859,544 A | 1/1999 | Norman | 326/40 |
| 5,861,761 A | 1/1999 | Kean | 326/41 |
| 5,869,979 A * | 2/1999 | Bocchino | 326/38 |
| 5,869,981 A | 2/1999 | Agrawal et al. | 326/39 |
| 5,870,586 A | 2/1999 | Baxter | 395/500 |
| 5,874,834 A * | 2/1999 | New | 326/39 |
| 5,878,051 A * | 3/1999 | Sharma et al. | 371/22.1 |
| 5,880,492 A | 3/1999 | Duong et al. | 257/209 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A * | 3/1999 | Lee et al. | 365/230.03 |
| 5,894,565 A * | 4/1999 | Furtek et al. | 395/500 |
| 5,959,466 A * | 9/1999 | McGowan | 326/39 |
| 5,991,908 A * | 11/1999 | Baxter et al. | 714/727 |
| 6,150,837 A * | 11/2000 | Beal et al. | 326/39 |
| 6,334,207 B1 * | 12/2001 | Joly et al. | 716/17 |
| 6,791,353 B1 * | 9/2004 | Beal et al. | 326/39 |

FOREIGN PATENT DOCUMENTS

| | | |
|---|---|---|
| EP | 0 746 104 A1 | 4/1996 |
| EP | 0 748 053 A2 | 12/1996 |
| EP | 0 889 593 A1 | 1/1999 |
| EP | 1 080 531 B1 | 3/2005 |
| JP | 06-275718 A | 9/1994 |
| WO | WO 93/12638 | 6/1993 |
| WO | 95/28769 A1 | 10/1995 |
| WO | 96/35261 A1 | 11/1996 |
| WO | 96/35262 A1 | 11/1996 |
| WO | 96/37047 A1 | 11/1996 |
| WO | 98/13938 A1 | 11/1999 |
| WO | 99/56394 A1 | 11/1999 |

OTHER PUBLICATIONS

A. Aggarwal et al., Routing Architectures for Hierarchical Field Programmable Gate Arrays, IEEE International COnference on COmputer Design: VLSI in Computers and Processors, pp. 475-478, Oct. 1994.*

M. Karjalainen et al., Blcok Diagram Compilation and Graphical Editing of DSP Algorithms in the QuickSig System, IEEE Circuits and Systems, pp. 1057-1060, Jun. 1988.*

L. R. Ashby, Interface Techniques for Embedding Custom Mega Cells In A Gate Array, IEEE Custom Integrated Circuits Conference, pp. 23.5.1-23.5.4, May 1993.*

A. El Gamal, An Architecture for Electrically Cofigurally Gate Arrays, IEEE Journal of Solid State Circuits, pp. 394-398, Apr. 1989.*

"ACT ™ 1 Field Programmable Gate Arrays for ACT 1010 and ACT1020", Actel Corporation, 1990, pp. 1-26, Mountain View, CA, USA.

"A10M20A Mask Programmed Gate Array" Preliminary Report, Actel Corporation, Jan. 1992, pp. 1-195 to 1-223, Mountain View, CA, USA.

"Array Architecture for ATG with 100% Fault Coverage", Technical Paper, Actel Corporation, Jan. 1992, pp. 1-225 to 1-235, Mountain View, CA, USA.

Klostermeyer H, "Die Schmelzkaseherstellung, Passage", Schmelzkaseherstellung, 1989, pp. 98-99, XP 002042364, Joha Leitfaden, Germany (Category A document, relevant to claim 1 and 21).

* cited by examiner

DEDICATED INTERFACE ARCHITECTURE FOR A HYBRID INTEGRATED CIRCUIT

BACKGROUND OF THE INVENTION

1. Field of the Invention

The present invention relates to a hybrid integrated circuit containing an FPGA portion and an ASIC portion. More particularly, this invention relates to an interface between the FPGA and the ASIC portions of a hybrid integrated circuit.

2. The Prior Art

A field programmable gate array (FPGA) may be programmed to execute a wide variety of logic functions, providing designers the ability to design circuits for specific applications. Other advantages of an FPGA are that the design time is short so it can be marketed much quicker and the design is such that can be changed easily. In an FPGA, however, many of the gates may go unused. An application-specific integrated circuit (ASIC), on the other hand, is designed only to perform certain specific tasks, and therefore does not result in wasted gates. However the design and testing phase of an ASIC is quite complex and expensive because an ASIC must be mask-programmed, and therefore the production of an ASIC only makes fiscal sense when the ASIC is to be produced in large quantities.

A hybrid integrated circuit (IC) provides some portion of the advantages of both designs. A hybrid IC includes both an FPGA and an ASIC portion. Of major concern in designing a hybrid IC is providing a suitable interface between the FPGA and ASIC portions of the IC. In order for the IC to perform its tasks properly, the FPGA and ASIC portions must be able to communicate effectively with each other. Conventionally, the interface has been designed to have the ASIC portion communicate with the FPGA portion, as will be described below, through the boundary between the FPGA portion and the ASIC portion using a plurality of connections between the edge of the ASIC portion and the edge of the FPGA portion.

FIGS. 1A-1F depict several examples of different designs of the layout architecture of a hybrid IC as known in the art. In FIGS. 1A-1F, each IC 2 has a plurality of I/O modules 10 running along the perimeter of the IC 2 wherein the orientation of the FPGA portion 14 and the ASIC portion 2 varies among the figures.

FIG. 1A illustrates a smaller ASIC portion 12 positioned below a larger FPGA portion 14. FIG. 1B illustrates a larger ASIC 12 portion positioned below a smaller FPGA 14 portion. FIG. 1C illustrates an ASIC portion 12 positioned at the bottom right corner of an FPGA portion 14. FIG. 1D illustrates an ASIC portion 12 positioned at the upper left corner of and FPGA portion 14. FIG. 1E illustrates an ASIC portion 12 positioned within an FPGA portion 14, near the bottom right corner. FIG. 1F illustrates an FPGA portion 14 positioned within an ASIC portion 12, near the upper left corner. It will be appreciated that other orientations of the FPGA portion 14 and the ASIC portion 12 of the IC 2 are well known in the art.

In FIG. 2, the FPGA portion 14 and the ASIC portion 12 of the IC 2 depicted in FIG. 1A are illustrated in greater detail. In FIG. 2, the FPGA portion 14 is made up of an array of logic modules 16 with horizontal and vertical routing resources provided for connecting the logic modules 16 as well as for communication with the ASIC portion 12. Communication between the ASIC portion 12 and the FPGA portion 14 is then accomplished by connecting the ASIC portion 12 to the boundary between the FPGA portion 14 and the ASIC portion 12. The boundary between the FPGA portion 14 and the ASIC portion 12 is connected to the vertical or horizontal routing resources. Signals are then sent from the ASIC portion 12 through the boundary between the ASIC portion 12 and the FPGA portion 14 and through the horizontal and vertical routing resources until reaching the desired logic modules 16. Communication from the logic modules 16 of the FPGA portion 14 to the ASIC portion 12 is accomplished in the reverse manner by sending signals from the desired logic modules 16 through the horizontal and vertical routing resources of the FPGA portion 14 until reaching the boundary between the FPGA portion 14 and the ASIC portion 12 and into the ASIC portion 12.

FIG. 3 depicts another embodiment of a hybrid IC as known in the art. This embodiment contains an FPGA portion 14 having a multi-level hierarchial design (in this example, a three-level hierarchial design) rather than simply an array of logic modules. The FPGA portion 14 comprises nine logic blocks 18 having horizontal and vertical routing resources. Each logic block 18 comprises another nine logic blocks 20 having local routing resources. The logic blocks in the second level of the hierarchial design will be termed clusters in this specification to distinguish them from the logic blocks in the first level of the hierarchial design. It should be appreciated, however, that since such a hierarchial design may conceivably have an unlimited number of levels, each having logic blocks and local routing resources, the term "cluster" should not be read as limiting the invention to only a three-level design. Each of the logic blocks (clusters) 20 then comprises a plurality of logic blocks, which in this example are logic modules with local routing resources, but may also be configurable function generators, logic blocks containing another level of logic blocks, etc.

Communication between the ASIC portion 12 and the FPGA portion 14 is accomplished by connecting the ASIC portion 12 to the boundary between the FPGA portion 14 and the ASIC portion 12 and the first level of horizontal or vertical routing resources to the boundary between the FPGA portion 14 and the ASIC portion 12. Signals are then sent from the ASIC portion 12 through the boundary between the FPGA portion 14 and the ASIC portion 12 and through the horizontal and vertical routing resources at the first hierarchial level (the routing resources positioned between each logic block 18). The signals then pass to the horizontal and vertical routing resources at the second hierarchial level (the routing resources between each logic block or cluster 20) and then the third hierarchial level (the routing resources between each logic block at this level).

The interfaces described have several drawbacks. First, these interfaces run at relatively slow speeds. This slow speed is exasperated by the relatively large distances between the logic modules and the interface. Second, routing congestion is common at the boundary between the FPGA portion 14 and the ASIC portion 12 in these types of designs. Alleviating this routing congestion using a routing resource requires that a significant amount of space be allocated for the routing resource between the FPGA portion 14 and the ASIC portion 12.

In addition to the routing and speed problems of the prior art interfaces, the fixed pin location and order for signals sent from the ASIC 12 portion to the FPGA 14 portion may cause FPGA place and route difficulties. Also, the asymmetrical number of I/O connections required for each side of the FPGA portion may also cause FPGA place and route difficulties.

Another drawback of these interfaces is that they require that both the FPGA portion 14 and the ASIC 12 portion be hardwired onto the IC 2 during the design phase. This prevents the use of interchangeable modules for the FPGA portion 14 and the ASIC portion 12.

Clearly, an interface between the FPGA and ASIC portions of a hybrid IC that does not suffer from the drawbacks of the prior art is needed.

BRIEF DESCRIPTION OF THE INVENTION

An interface design for a hybrid IC that utilizes dedicated interface tracks to allow signals to interface distributively with the logic blocks of the FPGA portion providing for faster and more efficient communication between the FPGA and ASIC portions of the hybrid IC.

According to a first embodiment of the present invention, a plurality of dedicated interface tracks are connected directly between the ASIC portion and each individual logic block at the lowest level of the FPGA portion of a hybrid IC. By providing a direct connection from the ASIC portion to individual logic blocks of the FPGA portion, the local routing resources may be bypassed. As a result, there is less congestion in the system.

According to a second aspect of the present invention, the dedicated interface tracks are connected directly between the ASIC portion to logic blocks at any level of the FPGA portion of a hybrid IC. Connection to the lowest level of logic blocks is accomplished using local routing resources. This design has the advantage of bypassing some of the local routing resources, easing congestion and increasing speed, but allowing some local routing resources to complete the connection to the logic blocks at the lowest level of the FPGA portion of the hybrid IC.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

According to a first embodiment of the present invention, a plurality of dedicated interface tracks are connected directly between the ASIC portion and each individual logic block at the lowest level of the FPGA portion of a hybrid IC. By providing a direct connection from the ASIC portion to individual logic blocks of the FPGA portion, the local routing resources may be bypassed. As a result, there is less congestion in the system.

According to a second aspect of the present invention, the dedicated interface tracks are connected directly between the ASIC portion to logic blocks at any level of the FPGA portion of a hybrid IC. This design has the advantage of bypassing some of the local routing resources, easing congestion and increasing speed, but allowing some local routing resources to complete the connection to the logic blocks at the lowest level of the FPGA portion of the hybrid IC.

One of ordinary skill in the art will recognize that the FPGA portion may have a hierarchial design made up of any number of levels, each level containing one or more blocks, each block possibly containing another level of blocks or, at the lowest level of the design, a logic module, configurable function generator, etc. Each level in the hierarchial design may then also contain local routing resources, allowing communication between each block but also allowing communication to a dedicated interface track if the designer so wishes.

Figure 1A:
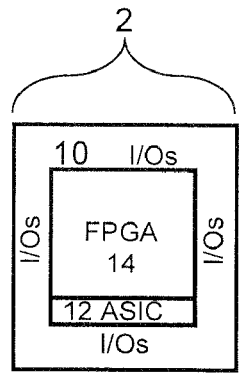
FIGS. 1A-1F illustrate various placements of the ASIC portion and FPGA portion of a hybrid IC as known previously in the art.
Figure 1B:
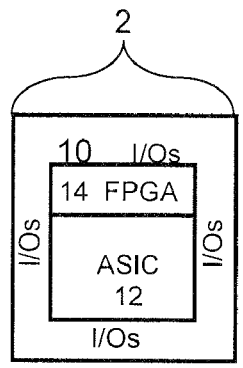
Figure 1C:
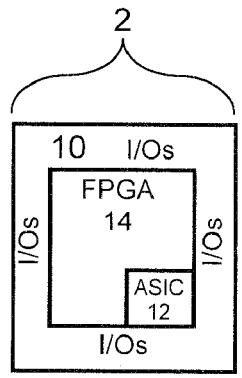
Figure 1D:
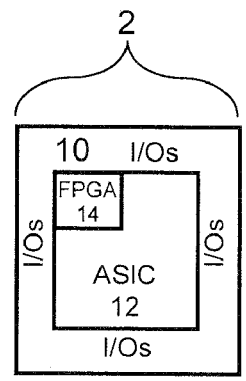
Figure 1E:
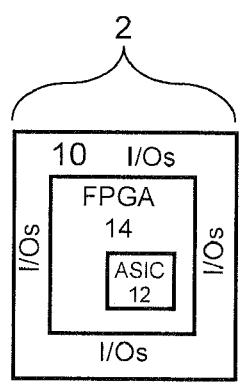
Figure 1F:
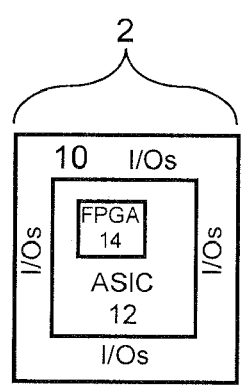
Figure 2:
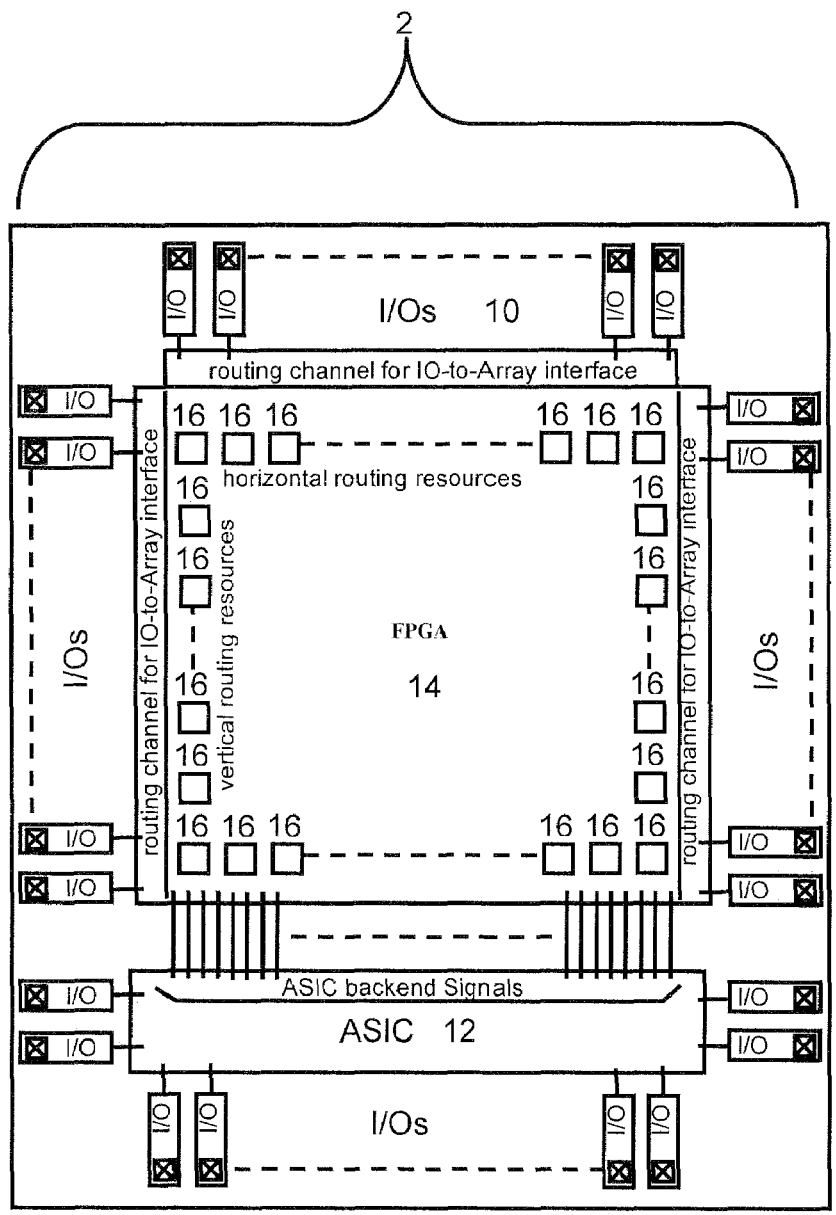
FIG. 2 illustrates a first embodiment known in the art of the arrangement of logic modules and their connection to an ASIC portion of a hybrid IC.
Figure 3:
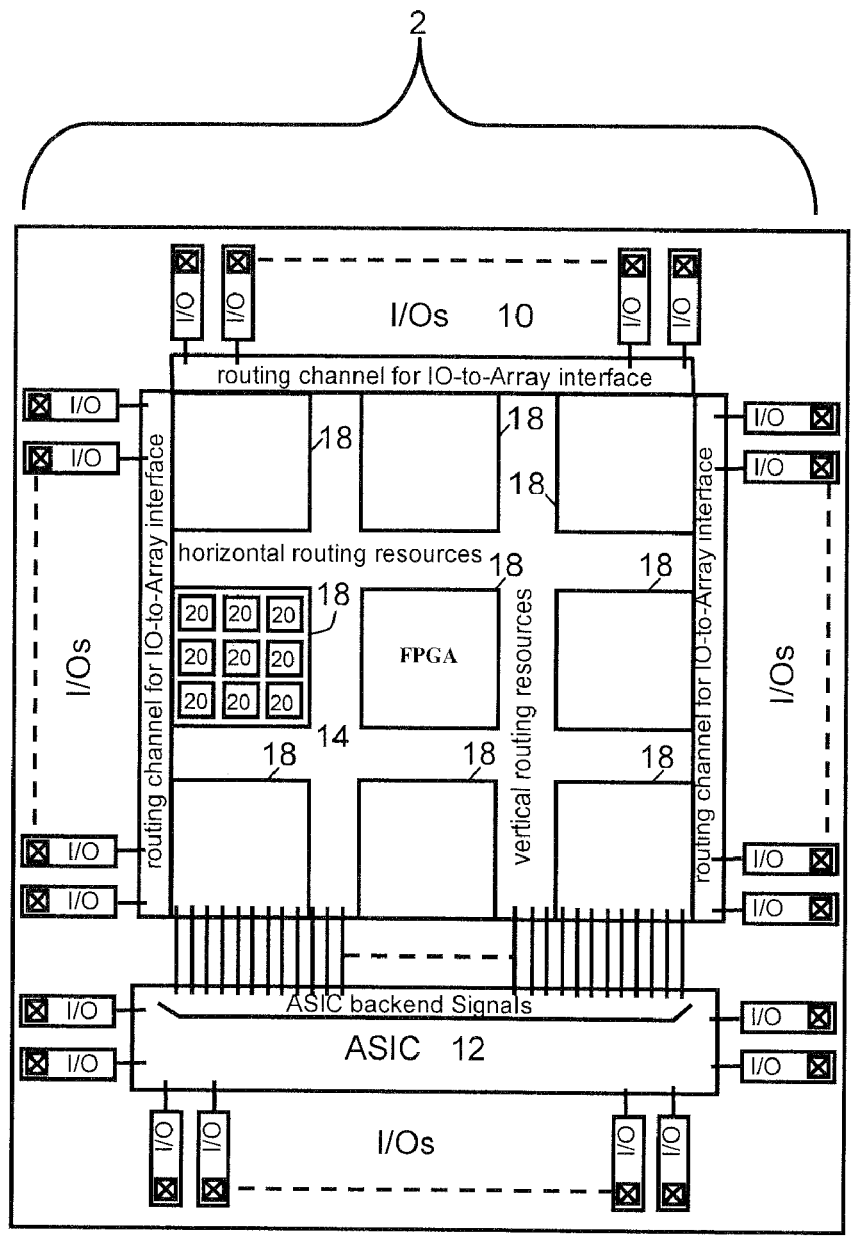
FIG. 3 illustrates a second embodiment known in the art of the arrangement of logic modules and their connection to an ASIC portion of a hybrid IC.
Figure 4:
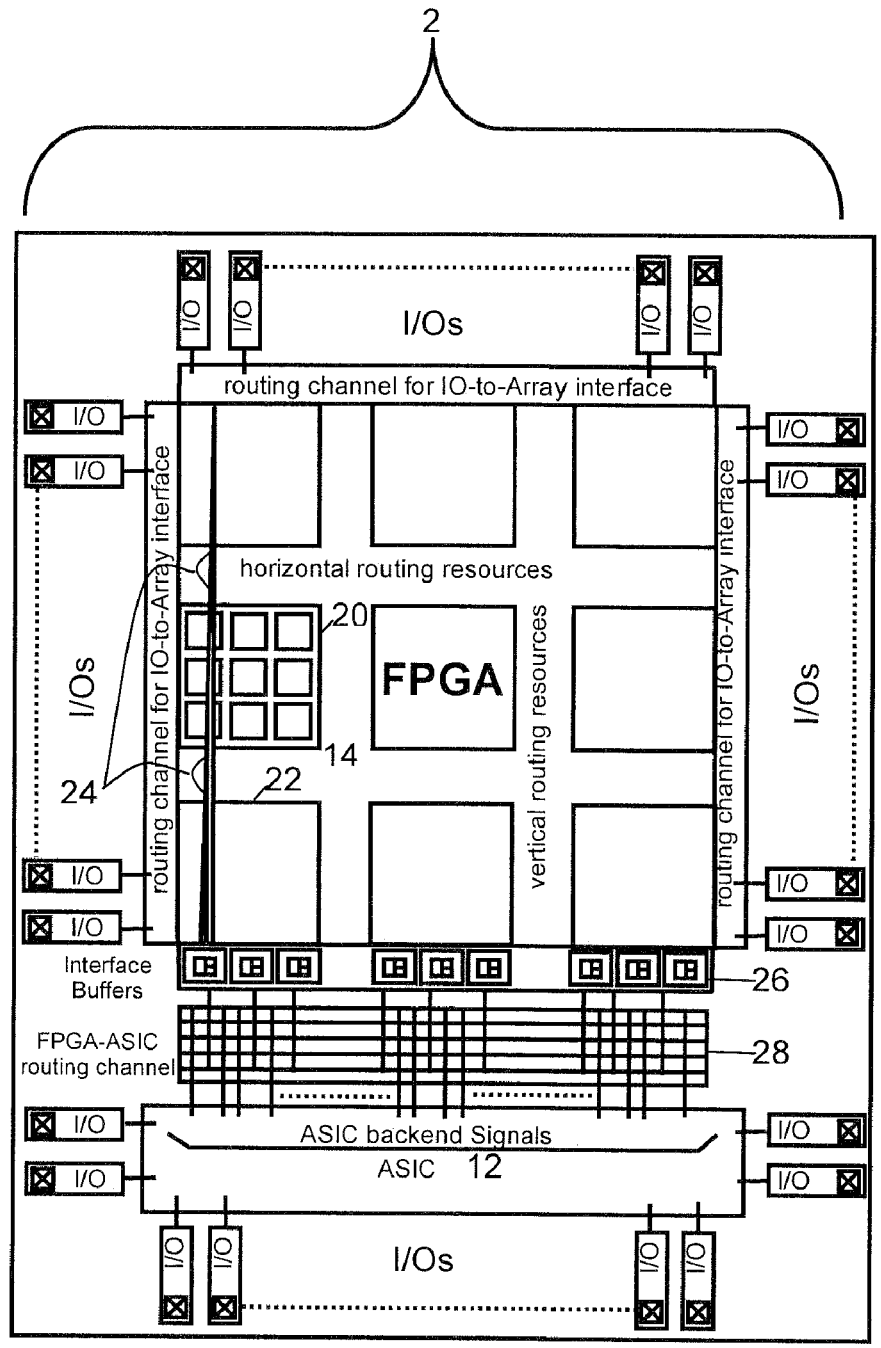
FIG. 4 illustrates a general view of a preferred embodiment according to the present invention.

A hierarchial FPGA architecture is depicted in FIG. 4 similar to that described above with respect to FIG. 3. Briefly, the hierarchial FPGA architecture has various horizontal and vertical interconnect conductors that programmably connect groups of logic resources at each level in the hierarchial design. FIG. 4 further illustrates a hybrid IC 2 architecture having dedicated interface tracks 24 connected between the ASIC portion 12 and each logic block 20 at the lowest level of the FPGA portion 14. The invention is not limited to direct connection to the logic blocks 20 in the hierarchial design of FIG. 4, but may also be employed to connect directly to the logic blocks at any level of the FPGA portion 14 of any hybrid IC. In an alternative embodiment, the dedicated interface tracks 24 may be connected to the local interconnect conductors between the logic blocks 20 of an FPGA portion of a hybrid IC. This may be accomplished by connecting the dedicated interface tracks 24 to the local interconnect conductors at the edge of a block 22 located on a higher level.

In FIG. 4, interface buffers 26 and a routing channel 28 are placed between the FPGA portions and the ASIC portion. The dedicated interface tracks 24 run from the individual components to the interface buffers 26. The interface buffers 26 are connected to the routing channel 28, which is then connected to the ASIC portion 12. Thus a signal from the ASIC portion 12 passes through the routing channel 28, then through the interface buffers 26, then to the dedicated interface tracks which complete the connection to individual logic modules. The interface buffers 26 and the routing channel 28 are, however, optional devices and are not required for the use of the present invention.

Figure 5:
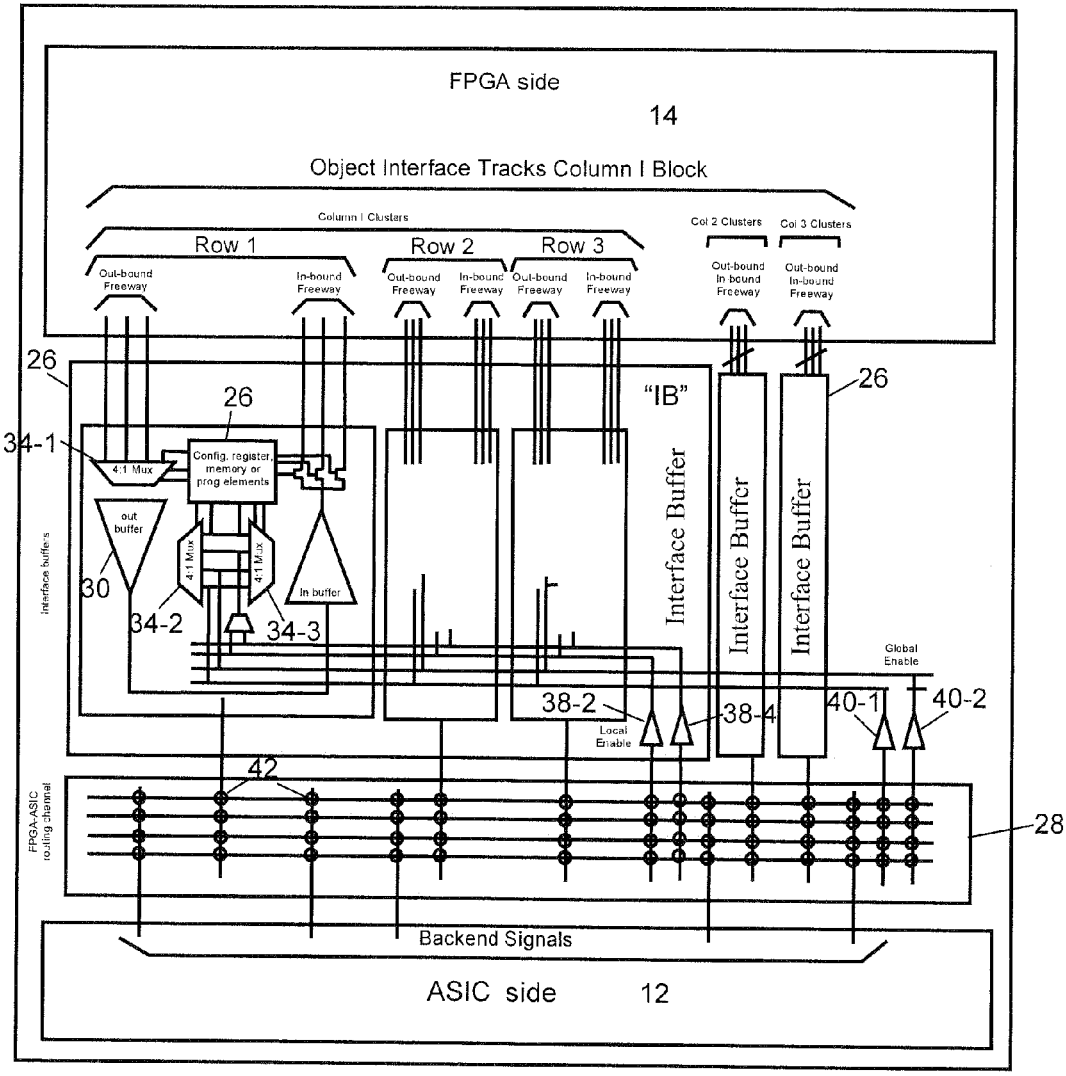
FIG. 5 illustrates in greater detail the embodiment in FIG. 4, indicating the internal workings of the FPGA-ASIC routing channel, the interface buffers, and the direct interface tracks.

FIG. 5 depicts the interface buffers 26 and the FPGA-ASIC routing channel 28 of FIG. 4 in greater detail. Each interface buffer 26 may include an output buffer 30, an input buffer 32, first, second, and third multiplexors 34-1, 34-2, and 34-3, a configurable register, memory, or programmable elements 36, and may also contain a first and second local enable 38-1 and 38-2. The first and second local enables 38-1 and 38-2 may be connected to programming elements in the FPGA-ASIC routing channel 28. The interface buffer 26, however, is not limited to this design and may be any type of buffering or logic device that performs buffering. Therefore, signals to be sent from the ASIC portion 12 to the FPGA portion 14 may first travel through the FPGA-ASIC routing channel 28, which directs them to the appropriate local enables 38, which in turn travel through the interface buffer 26 to the appropriate inbound dedicated interface track leading to a logic block in the FPGA portion 14. Should the same signals need to be sent to a plurality of logic blocks of an FPGA portion 14 at the same time, global enables 40, which connect to all of the interface buffers in the same way that the local enables 38 connect to single interface buffers, may be used.

Signals from the FPGA portion 14 to the ASIC portion 12 are handled in the reverse direction. One interesting result of the design of the interface buffers depicted in FIG. 5 is the ability of the interface buffers to route the output of the FPGA portion 14 back into the FPGA portion 14 without first going through the FPGA-ASIC routing channel 28 or through the ASIC 14 itself. This allows for more flexibility in the design and programming of these integrated circuits, as communication between elements of the FPGA portion 14 may be facilitated without the use of routing resources within the FPGA portion 14 itself.

The FPGA-ASIC routing channel 28 depicted in FIG. 5 may be either hardwired or contain a plurality of programming elements 42. These programming elements may be elements like an SRAM, an antifuse, and an EPROM, for example. This routing resource is employed to facilitate the distribution of the signals between the ASIC portion 12 and the FPGA portion 14. It will be appreciated by those of ordinary skill in the art that there are many ways to accomplish this distribution of signals, only one of which is through an FPGA-ASIC routing channel 28.

Figure 6:
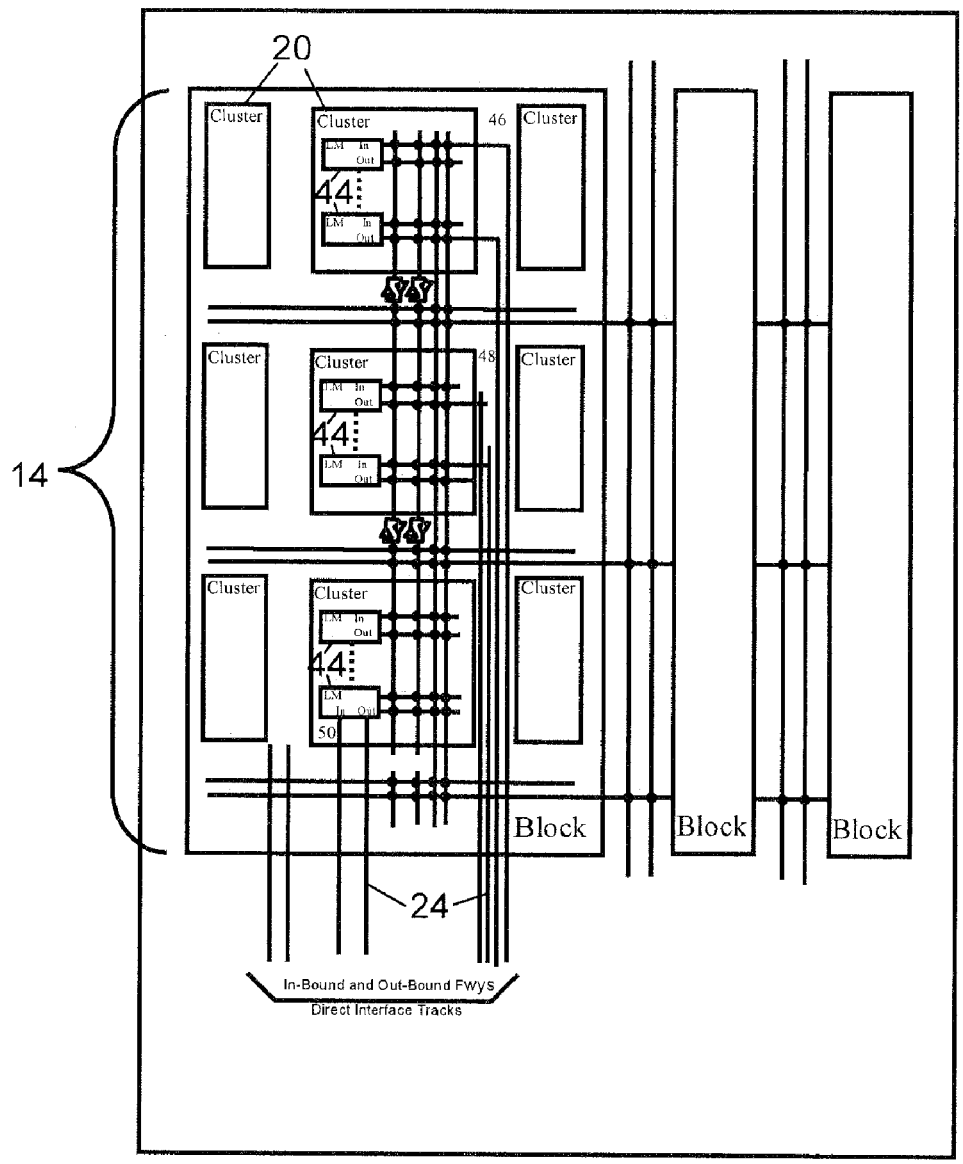
FIG. 6. illustrates in greater detail the embodiment in FIG. 4, indicating how the direct interface tracks connect to the logic modules or local or global routing resources.

FIG. 6 illustrates in greater detail the connections between the dedicated interface tracks and the individual blocks or modules, or local or global routing resources of the FPGA portion 14 of the hybrid FPGA-ASIC 2 of FIG. 4. In FIG. 6, logic modules are depicted as the blocks 44 at the lowest level of the FPGA portion 14. However, those of ordinary skill in the art will recognize that any number of different types of modules may be placed at the lowest level of an FPGA portion 14. FIG. 6 depicts three of the many different ways in which the dedicated interface tracks 24 may be connected. Junction 46 shows a dedicated interface track 24 hardwired to a block (cluster) 20 in the second level of the hierarchial design. Junction 48 shows a dedicated interface track 24 connected to a block (cluster) 20 in the second level of the hierarchial design through the use of a programmable element. In the blocks 20 connected to each of junctions 46 and 48, local routing resources within the block 20 will have to complete the connected between the dedicated interface tracks 24 and the logic block 44 at the lowest level of the design. Junction 50 depicts a dedicated interface track 24 connected directly to a block 44 at the lowest level of the FPGA portion 14.

Connecting the dedicated interface tracks directly to each block 44 at the lowest level of the FPGA portion 14 results in less congestion and, therefore, higher speed communications through the integrated circuit. However, connection directly to each block 44 at the lowest level of the FPGA portion 14 requires a large number of direct interface tracks 24. Therefore, it may be desirable to connect a portion or all of the dedicated interface tracks 24 to blocks at a higher level of the hierarchial design and allow local routing resources to complete the connection. This will reduce the number of dedicated interface tracks 24 required on the IC. While this will also reduce the speed of the communications, it is still faster than the prior art interfaces and it avoids the routing congestion at the FPGA-ASIC boundary that occurs in the prior art.

Figure 7:
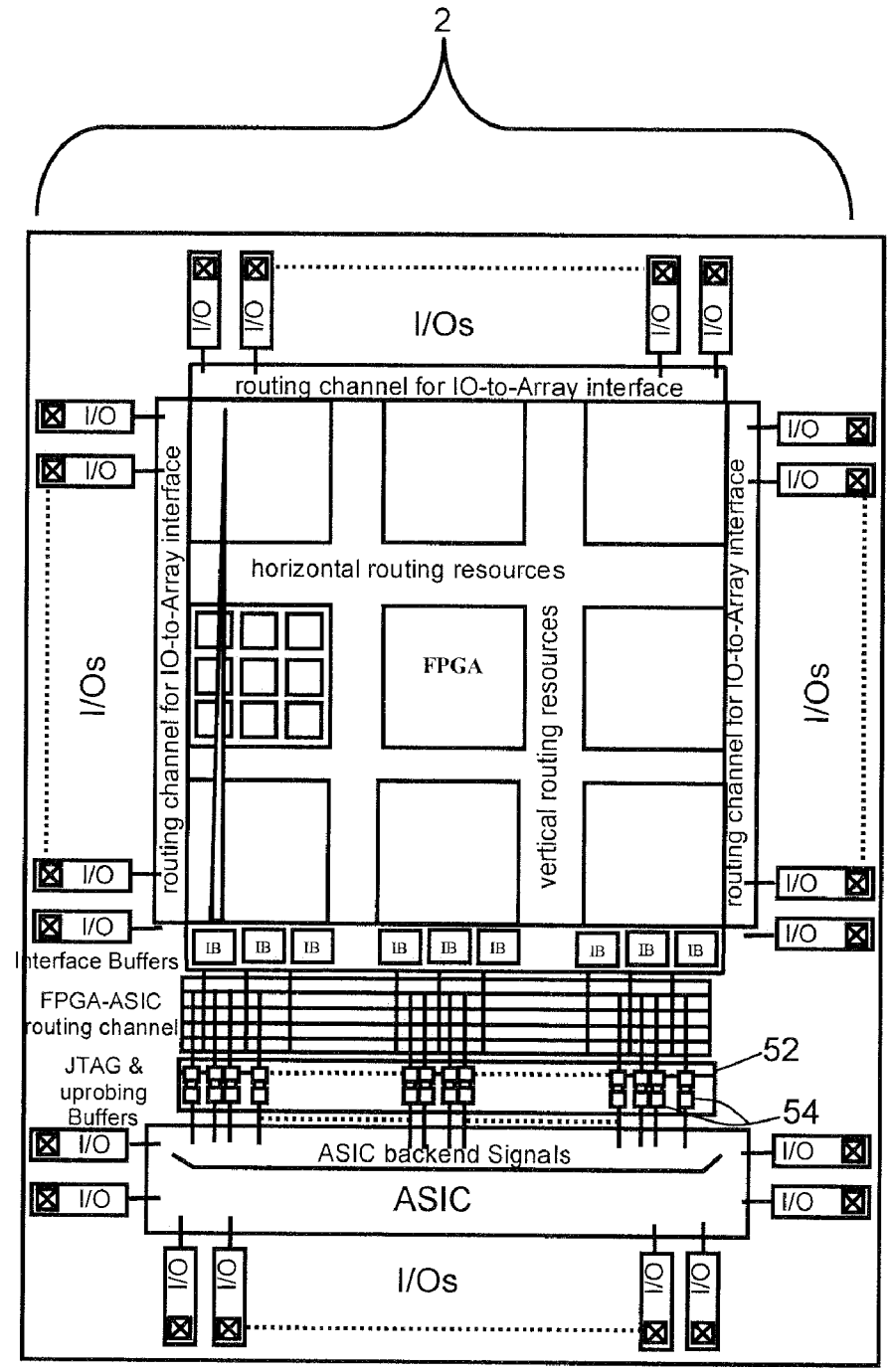
FIG. 7 illustrates another embodiment of the present invention, indicating the addition of JTAG or other diagnostic buffers to the connection between the ASIC portion and the FPGA portion of the hybrid IC.

In an alternative embodiment illustrated in FIG. 7, a JTAG or other diagnostic 52 feature is depicted having a plurality of JTAG or diagnostic buffers 54. This feature is useful in testing the hybrid IC 2.

Figure 8:
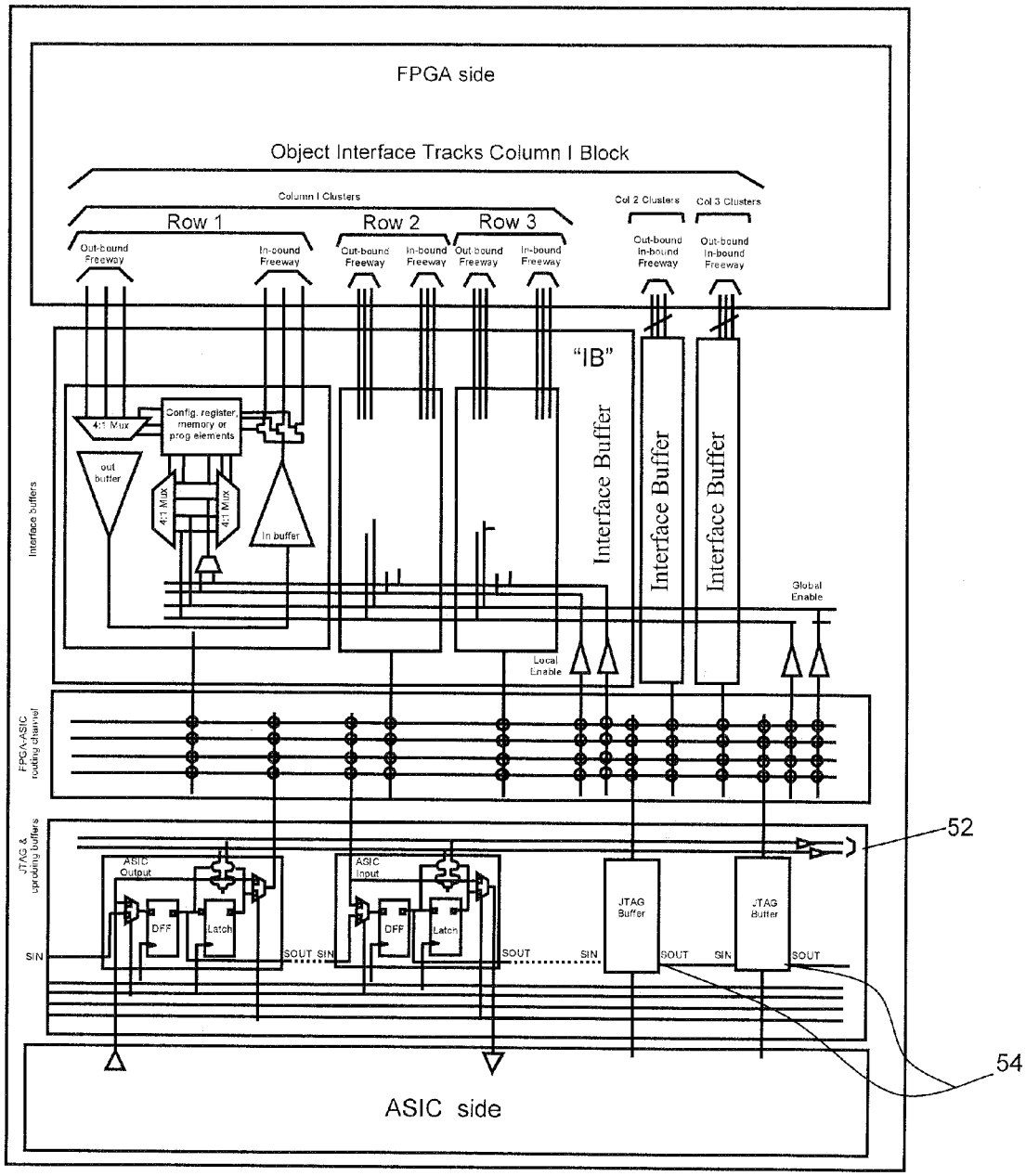
FIG. 8 illustrates in greater detail the embodiment in FIG. 7, indicating the internal workings of the FPGA-ASIC routing channel, the interface buffers, the JTAG buffers, and the direct interface tracks.

FIG. 8 depicts the bottom of an IC containing such a JTAG or other diagnostic feature 52 as illustrated in FIG. 7 in greater detail. One of ordinary skill in the art will recognize that the JTAG or other diagnostic feature 52 is only one way to test a hybrid IC, and it may be implemented in many possible ways, only one of which is depicted in the figures.

Figure 9:
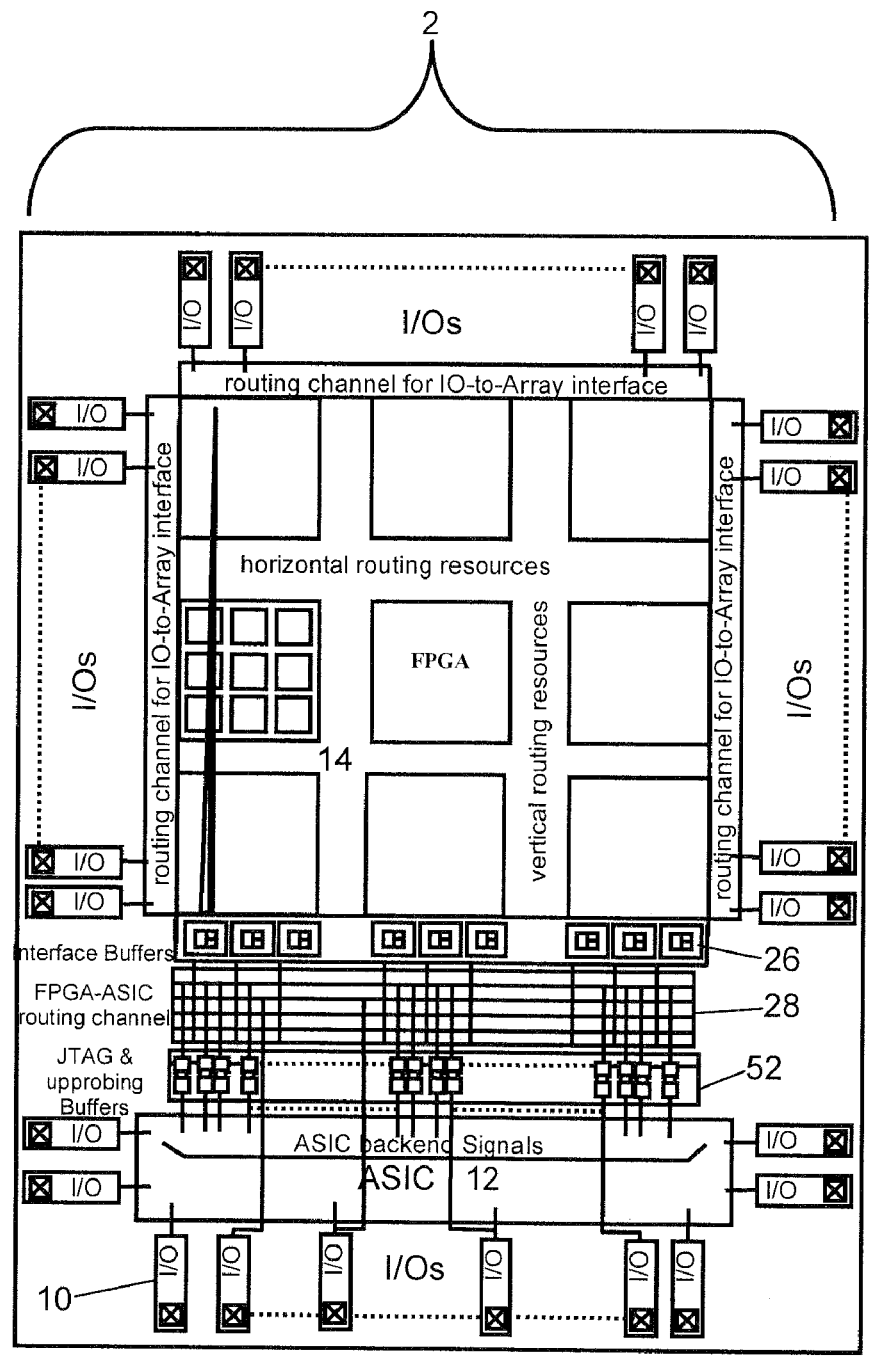
FIG. 9 illustrates another embodiment of the present invention, indicating how the I/O modules may be directly interfaced with the FPGA through the interface between the FPGA portion and the ASIC portion.

In another alternative embodiment illustrated in FIG. 9, I/O modules 10 which had, in previous figures, been attached directly to the ASIC portion 12, may instead be directly interfaced with the FPGA 14, either with or without the JTAG or other diagnostic feature 52, the FPGA-ASIC routing channel 28, and the interface buffers 26. Additionally, I/O modules 10 may be connected directly to the FPGA-ASIC routing channel 28 or to the JTAG or other diagnostic buffers 52. Individual I/O modules may also be connected to more than one device, proving input or output to multiple devices simultaneously.

Figure 10:
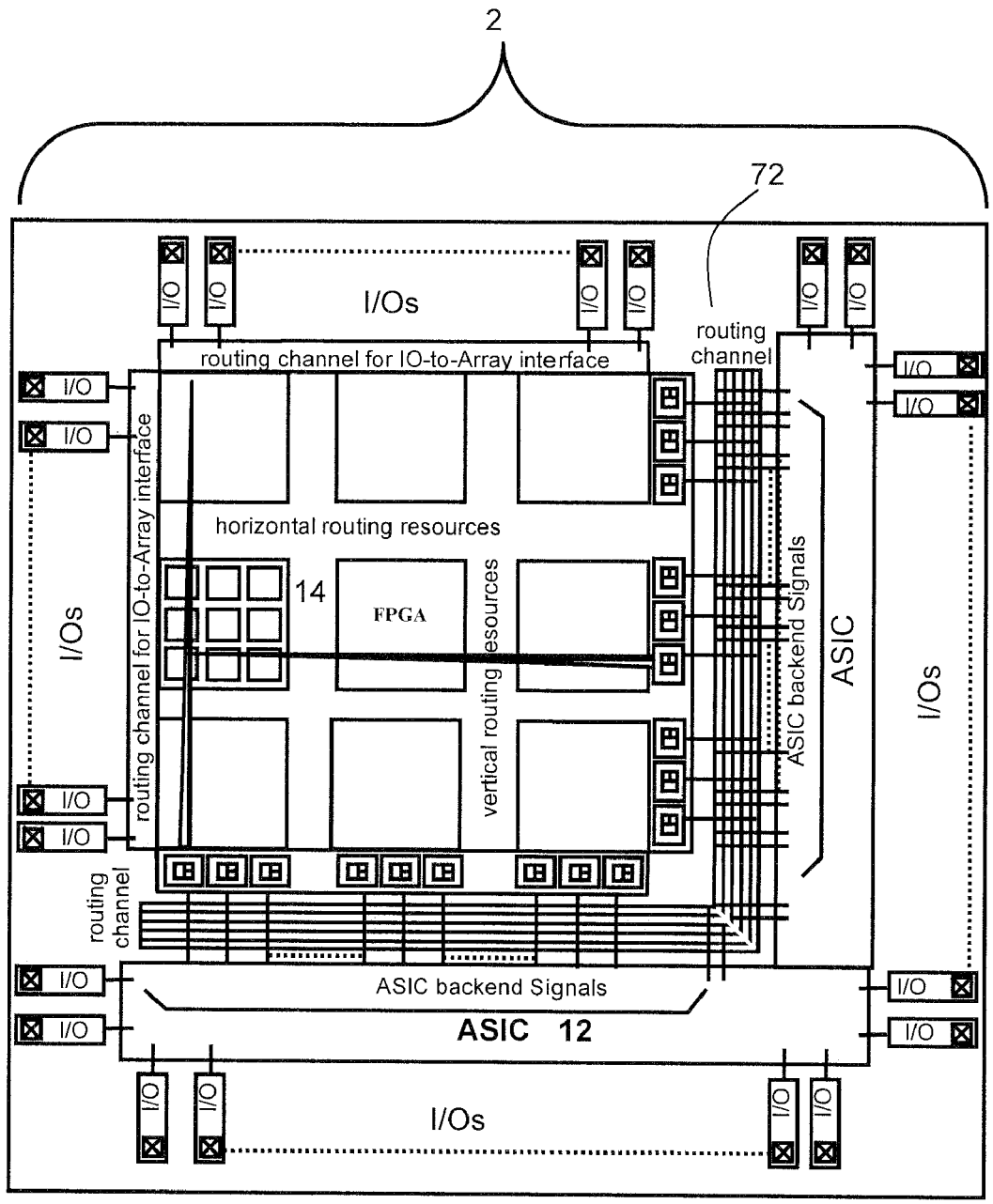
FIG. 10 illustrates another embodiment of the present invention, indicating how the interface may be expanded to two sides of the IC.

In FIG. 10, according to the present invention, a second side 72 of the hybrid IC is illustrated. Dedicated interface tracks from the second side 72 may either directly interface with the logic blocks of the FPGA portion 14 or interface with the dedicated interface tracks of the first side using programmable elements or the like. Those of ordinary skill in the art will recognize that there are many possible ways to connect the dedicated interface tracks of the second side 72 to either the FPGA portion 14 or the dedicated interface tracks of the first side. It is also clear that the present invention may similarly be expanded to a three or a four-sided embodiment.

Figure 11:
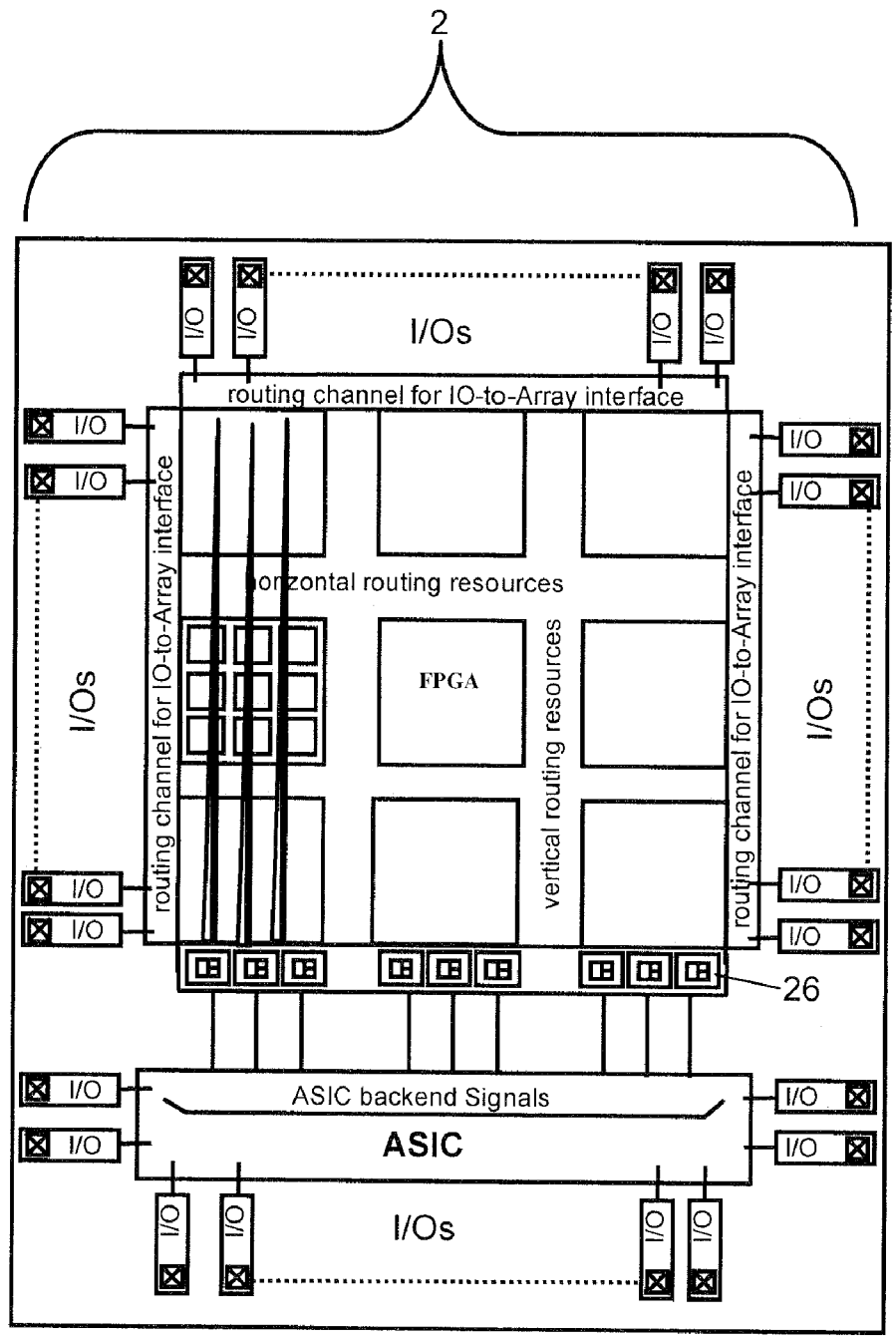
FIG. 11 illustrates another embodiment of the present invention, indicating how the ASIC portion may be connected directly to the interface buffers, without passing through a programmable routing channel.
Figure 12:
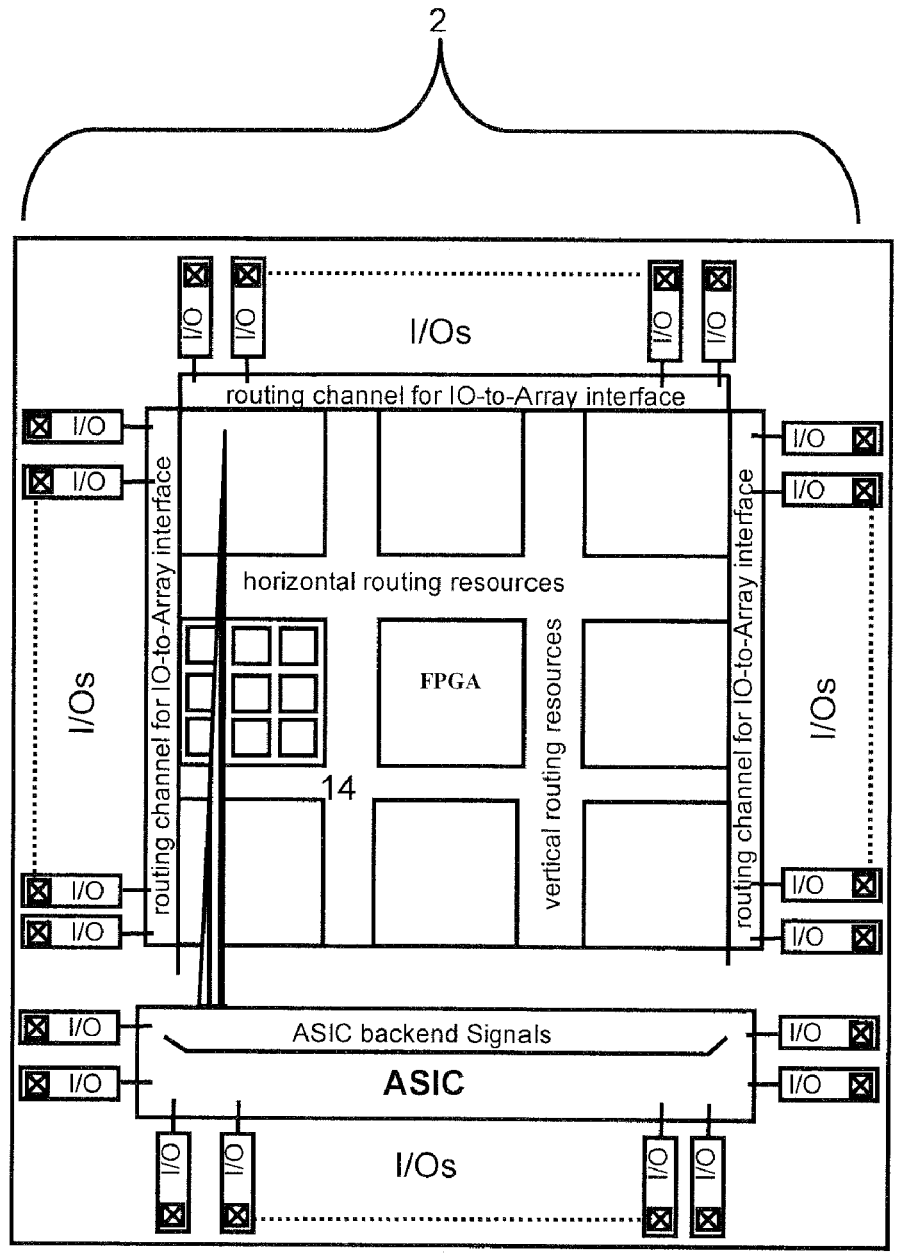
FIG. 12 illustrates another embodiment of the present invention, indicating that the ASIC portion may be connected directly to the FPGA portion, without passing through a programmable routing channel or interface buffers.

FIG. 11 depicts an example of a hybrid IC 2 that utilizes interface buffers 26 but not an FPGA-ASIC routing channel. FIG. 12 depicts an example of a hybrid IC 2 that does not utilize either interface buffers or a FPGA-ASIC routing channel, but instead connects the ASIC portion 12 directly to the FPGA portion 14 through the dedicated interface tracks.

Figure 13:
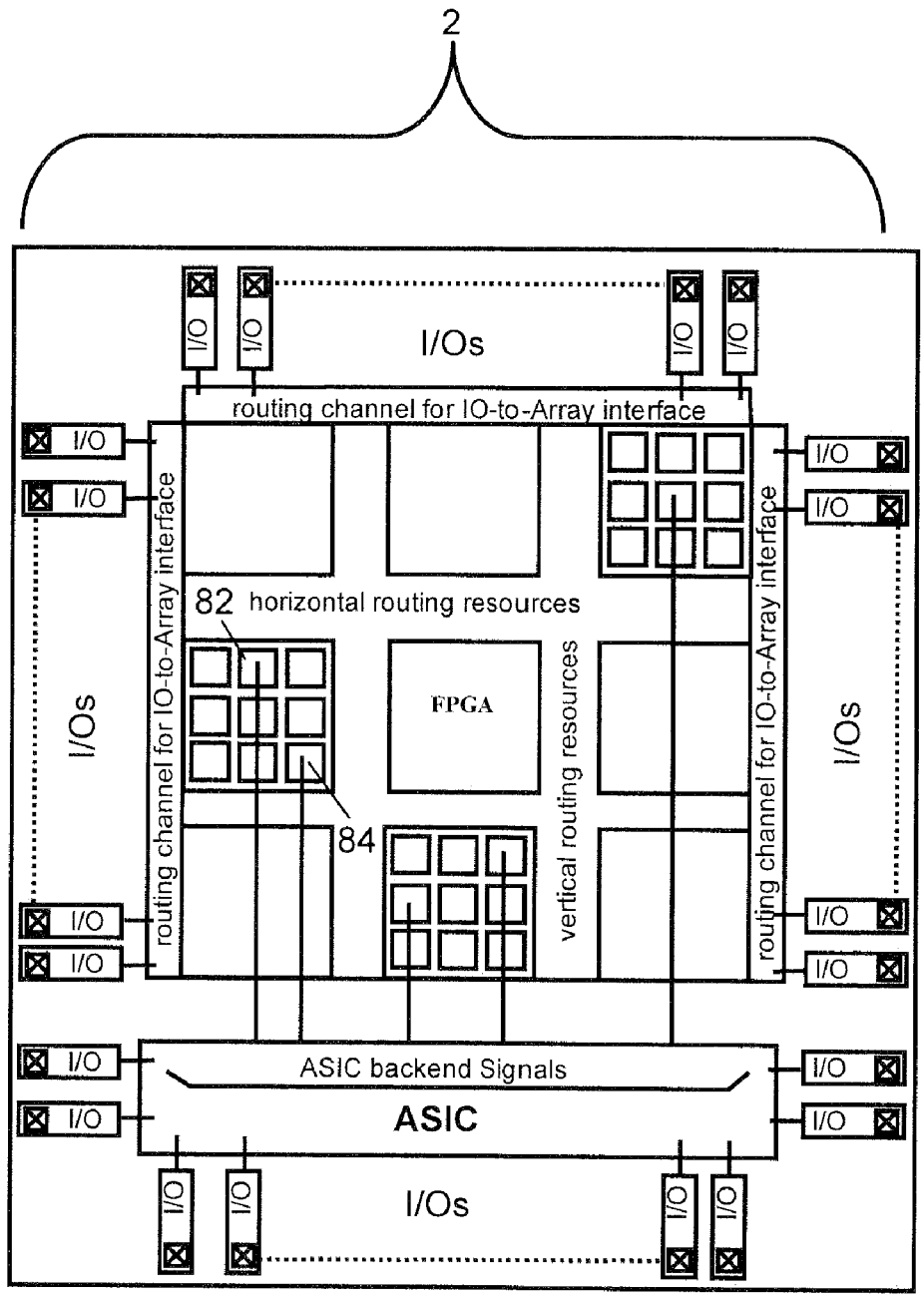
FIG. 13 illustrates another embodiment of the present invention, indicating that the I/O modules or interface buffers may be located inside the individual components.
Figure 14:
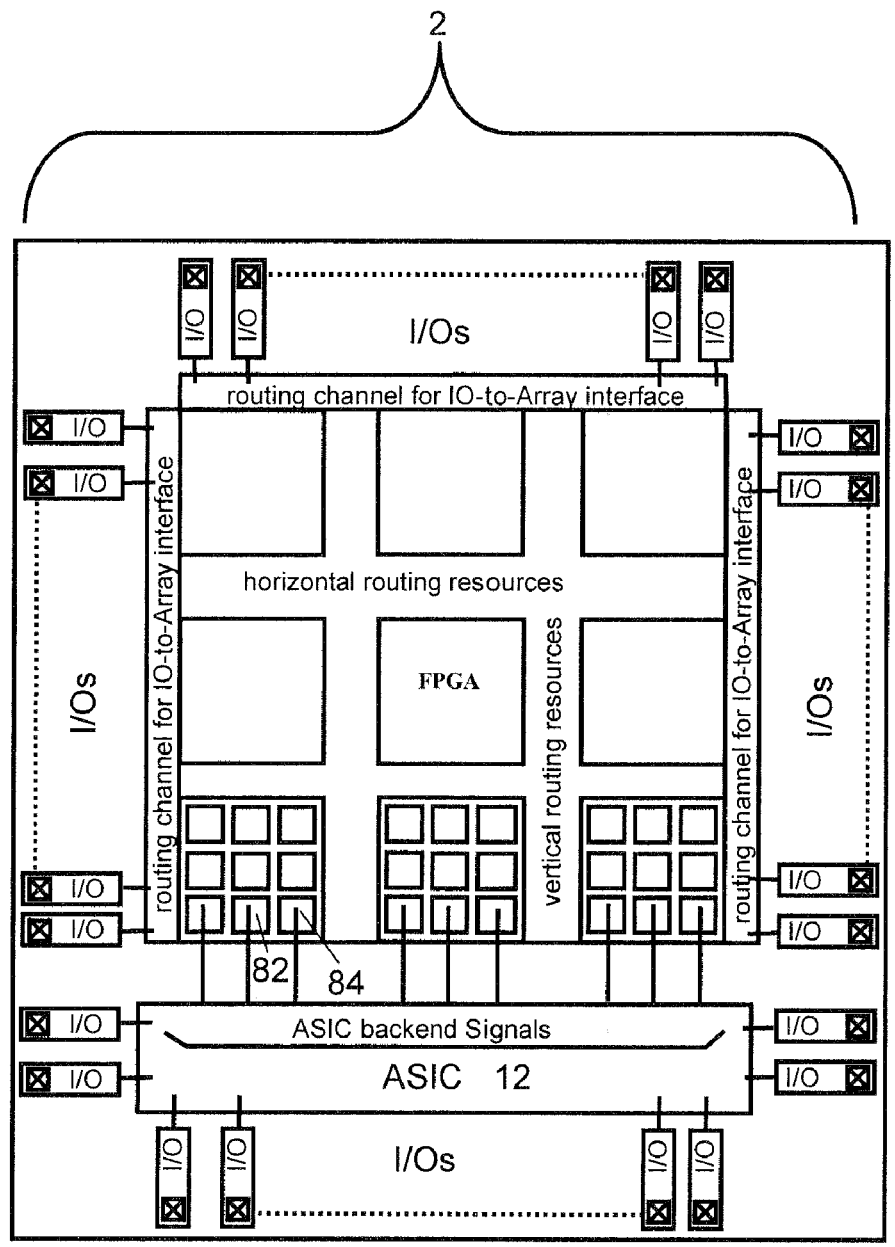
FIG. 14 illustrates another embodiment of the present invention, indicating that the I/O modules or interface buffers may be located inside the individual components, residing only in the bottom row of components.

FIG. 13 illustrates another way to place interface buffers or I/O modules on the hybrid FPGA-ASIC. An input/output module (IOM) 82 or an interface buffer 84 may be placed inside the logic blocks in the FPGA portion should the designer so desire. FIG. 14 depicts a design similar to that of FIG. 13, except where each IOM 82 and interface buffer 84 is placed in the bottom row of blocks or clusters in order to reduce the length of the dedicated interface tracks that connect them to the ASIC portion.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An interface architecture in an integrated circuit comprising:
   an FPGA portion of said integrated circuit having logic blocks for implementing logic functions and interconnect conductors for programmably connecting said logic blocks
   an ASIC portion of said integrated circuit having mask programmed logic circuits and mask programmed interconnect conductors between said logic circuits;
   mask programmed dedicated interface tracks connected between said logic blocks in said FPGA portion and said mask programmed interconnect conductors in said ASIC portion; and
   interface buffers disposed in series with said dedicated interface tracks between said FPGA portion and said ASIC portion, each interface buffer including an input buffer, an output buffer connected to said input buffer, three multiplexers, two of said multiplexers connected to said output buffer and one of said multiplexers connected to said input buffer.

2. The interface architecture of claim 1, wherein interconnect conductors in said FPGA portion include local routing resources.

3. The interface architecture of claim 1 wherein each of said interface buffers further includes a configurable register, said configurable register connected to the select inputs of each of said multiplexers.

4. The interface architecture of claim 1 wherein each of said interface buffers further includes a memory store, said memory store connected to the select inputs of each of said multiplexers.

5. The interface architecture of claim 1 wherein each of said interface buffers further includes programmable elements, said programmable elements connected to the select inputs of each of said multiplexers.

6. The interface architecture of claim 1, further including an FPGA-ASIC routing channel arranged between said dedicated interface tracks and said ASIC portion.

7. The interface architecture of claim 6, wherein said FPGA-ASIC routing channel is mask-programmable.

8. The interface architecture of claim 6, wherein said FPGA-ASIC routing channel is field-programmable.

9. The interface architecture of claim 8, further including a plurality of I/O modules arranged on the perimeter of the IC.

10. The interface architecture of claim 9, wherein one or more of said I/O modules are connected to said FPGA-ASIC routing channel.

11. The interface architecture IC of claim 1, further including JTAG buffers arranged between said dedicated interface tracks and said ASIC portion.

12. The interface architecture of claim 1, further including a plurality of I/O modules arranged on the perimeter of the IC.

13. The interface architecture of claim 12, wherein one or more of said I/O modules are connected to said FPGA portion through a routing channel.

14. The interface architecture of claim 12, wherein one or more of said I/O modules are connected to said ASIC portion.

15. The interface architecture of claim 1, wherein said ASIC portion is adjacent to one side of said FPGA portion.

16. The interface architecture of claim 1, wherein said ASIC portion is adjacent to two sides of said FPGA portion.

17. The interface architecture of claim 1, wherein said ASIC portion is adjacent to three sides of said FPGA portion.

18. The interface architecture of claim 1, wherein said ASIC portion is adjacent to four sides of said FPGA portion.

19. The interface architecture of claim 1, wherein said FPGA portion has a hierarchial design including a plurality of levels, each of said levels containing local routing resources and a plurality of blocks, each of said blocks including either a module or another of said levels.

20. An interface architecture in an integrated circuit comprising:
   an FPGA portion of said integrated circuit having a plurality of levels, each of said levels containing local routing resources and a plurality of blocks, each of said blocks including either a module or another of said levels;
   an ASIC portion of said integrated circuit having mask programmed interconnect conductors between logic portions of said ASIC portion;
   mask programmed dedicated interface tracks connected between said modules or blocks in said FPGA portion and said mask programmed interconnect conductors in said ASIC portion and
   interface buffers arranged between said dedicated interface tracks and said ASIC portion, each interface buffer including an input buffer, an output buffer connected to said input buffer, three multiplexers, two of said multiplexers connected to said output buffer and one of said multiplexers connected to said input buffer.

21. The interface architecture of claim 20, wherein each of said blocks in said FPGA portion contains local routing resources.

22. The interface architecture of claim 20 wherein each of said interface buffers further includes a configurable register, said configurable register connected to the select inputs of each of said multiplexers.

23. The interface architecture of claim 20 wherein each of said interface buffers further includes a memory store, said memory store connected to the select inputs of each of said multiplexers.

24. The interface architecture of claim 20 wherein each of said interface buffers further includes programmable elements, said programmable elements connected to the select inputs of each of said multiplexers.

25. The interface architecture of claim 20, further including an FPGA-ASIC routing channel arranged between said dedicated interface tracks and said ASIC portion.

26. The interface architecture of claim 25, wherein said FPGA-ASIC routing channel is mask-programmable.

27. The interface architecture of claim 25, wherein said FPGA-ASIC routing channel is field-programmable.

28. The interface architecture of claim 27, further including a plurality of I/O modules arranged on the perimeter of the integrated circuit.

29. The interface architecture of claim 28, wherein one or more of said I/O modules are connected to said FPGA-ASIC routing channel.

30. The interface architecture of claim 20, further including JTAG buffers arranged between said dedicated interface tracks and said ASIC portion.

31. The interface architecture of claim 20, further including a plurality of I/O modules arranged on the perimeter of the IC.

32. The interface architecture of claim 31, wherein one or more of said I/O modules are connected to said FPGA portion through a routing channel.

33. The interface architecture of claim 31, wherein one or more of said I/O modules are connected to said ASIC portion.

34. The interface architecture of claim 20, wherein said ASIC portion is adjacent to one side of said FPGA portion.

35. The interface architecture of claim 20, wherein said ASIC portion is adjacent to two sides of said FPGA portion.

36. The interface architecture of claim 20, wherein said ASIC portion is adjacent to three sides of said FPGA portion.

37. The interface architecture of claim 20, wherein said ASIC portion is adjacent to four sides of said FPGA portion.

\* \* \* \* \*